United States Patent [19]

Kuriyama

[11] Patent Number: 5,376,176

[45] Date of Patent: Dec. 27, 1994

[54] SILICON OXIDE FILM GROWING APPARATUS

[75] Inventor: Atsushi Kuriyama, Tokyo, Japan

[73] Assignee: NEC Corporation, Japan

[21] Appl. No.: 488

[22] Filed: Jan. 5, 1993

[30] Foreign Application Priority Data

Jan. 8, 1992 [JP] Japan .................. 4-019549

[51] Int. Cl.$^5$ .................. B05C 3/00; B05B 1/00; B05B 7/00
[52] U.S. Cl. .................. 118/313; 118/320; 118/421; 118/423; 118/429; 29/25.01
[58] Field of Search .................. 29/25.01; 437/228; 118/400, 429, 423, 313, 320, 602, 612, 708, 421, 402

[56] References Cited

U.S. PATENT DOCUMENTS

| | | | |
|---|---|---|---|
| 4,917,123 | 4/1990 | McConnell et al. | 134/95 |
| 4,971,920 | 11/1990 | Miyashita et al. | 437/10 |
| 5,232,511 | 8/1993 | Bergman | 134/2 |

FOREIGN PATENT DOCUMENTS

| | | |
|---|---|---|
| 60-168574 | 11/1985 | Japan . |
| 63-102738 | 7/1988 | Japan . |
| 3-21043 | 1/1991 | Japan . |

Primary Examiner—Olik Chaudhuri
Assistant Examiner—Richard A. Booth
Attorney, Agent, or Firm—Laff, Whitesel, Conte & Saret, Ltd.

[57] ABSTRACT

According to this invention, a silicon oxide film growing apparatus includes a single wafer film-forming processing tank, a post processing unit, and a wafer conveying robot. The single wafer film-forming processing tank selectively grows a silicon oxide film by a liquid-phase growing method on only a silicon oxide film on a surface of a semiconductor wafer. The post processing unit washes the surface of the semiconductor wafer. The wafer conveying robot conveys the semiconductor wafer between the film-forming processing tank and the post processing unit.

7 Claims, 1 Drawing Sheet

SILICON OXIDE FILM GROWING APPARATUS

BACKGROUND OF THE INVENTION

The present invention relates to a silicon oxide film growing apparatus and, more particularly, to a liquid-phase selective silicon oxide film growing apparatus for selectively forming an insulating film on a semiconductor wafer.

In a conventional silicon oxide film growing apparatus, as shown in a sectional view of a main part in FIG. 2, a tank 1 comprises an immersing unit 19, a straightening unit 3, and a processing liquid adjustment unit 4. The immersing unit 19 is used for causing the processing tank 1 to immerse a semiconductor wafer 5 in a processing liquid. The straightening unit 3 is contiguous to the immersing unit 19 to straighten the flow of the processing liquid flowing into the immersing unit 19. The processing liquid adjustment unit 4 is contiguous to the immersing unit 19 to adjust the processing liquid flowing from the immersing unit 19.

The conventional apparatus includes a straightening plate 6 arranged at the boundary between the immersing unit 19 and the straightening unit 3, a liquid supply pipe 20 for supplying the processing liquid in the processing liquid adjustment unit 4 to the straightening unit 3, a liquid supply pump 11 and a processing liquid filter 12 arranged midway along the water supply pipe 20, and a processing liquid adjustment device 21, arranged in the processing liquid adjustment unit 4, for adding an aqueous boric acid solution to the processing liquid.

In addition, the processing tank 1 is arranged in a constant temperature tank 8 to keep the temperature of the processing liquid in the processing tank 1 to be constant (e.g., Japanese Utility Model Laid-Open Nos. 60-168574 and 63-102738). In order to adjust the processing liquid, it is proposed to immerse an aluminum plate in the processing liquid adjustment unit 4 in place of adding the aqueous boric acid solution to the processing liquid (e.g., Japanese Patent Laid-Open No. 3-21043).

A silicon oxide film growing apparatus aims at selectively depositing and growing a silicon oxide film on only a silicon oxide film on the surface of a semiconductor wafer in which a photoresist film pattern or a metal wiring pattern having a desired shape is formed on the silicon oxide film.

In the conventional silicon oxide film growing apparatus, however, since a method of entirely immersing the semiconductor wafer in the processing liquid is employed, the processing liquid is brought into contact with the rear surface of the semiconductor wafer.

Metal dust or photoresist dust is adhered to the rear surface of the semiconductor wafer. When the dust is mixed in the processing liquid, the service life of the processing liquid is disadvantageously shortened.

In addition, since the rear surface of the semiconductor wafer is not smoothed, a part of a silicon oxide film grown on the rear surface is peeled and drifts in the processing liquid as particles.

In the conventional silicon oxide film growing apparatus, although a processing tank and a processing liquid pipe consist of acrylic or vinyl chloride plastics, silicon oxides are easily precipitated on the surfaces of these materials from the processing liquid. For this reason, particles are produced, and the service life of the processing liquid is shortened.

In the conventional silicon oxide film growing apparatus, although a method of immersing a plurality of semiconductor wafers in one processing tank to grow silicon oxide films is employed, the entire silicon oxide film growing apparatus is occupied by a very small number of semiconductor wafers when various types of semiconductor wafers are produced in very small amounts. For this reason, the silicon oxide film growing apparatus has a drawback, i.e., very low productivity.

This drawback is a very serious problem in the present situation wherein liquid-phase growth of a silicon oxide film must be performed as long as several hours.

In addition, in the conventional silicon oxide film growing apparatus, selectivity for selectively growing a silicon oxide film on only a silicon oxide film on the surface of a semiconductor wafer is another problem.

According to an experiment performed by the present inventors, a growth rate of a silicon oxide film on the surface of a semiconductor wafer in an immersion unit was about 1,000 Å/h when the temperature of the processing liquid was 35° C. In this case, particles each having a diameter of about 1,000 Å were adhered to a photoresist pattern at 50,000 to 100,000 particles/mm$^2$.

Thereafter, when the growth of the silicon oxide film is further continued, since silicon oxide films are grown on these particles, the silicon oxide films which can not be removed are finally adhered to the photoresist or a metal wiring layer, and a desired pattern can not be formed.

SUMMARY OF THE INVENTION

It is an object of the present invention to provide a liquid-phase selective silicon oxide film growing apparatus for suppressing production of particles into processing liquid.

It is another object of the present invention to provide a liquid-phase selective silicon oxide film growing apparatus having improved selectivity of a resist or a metal wiring layer on the surface of a semiconductor wafer.

It is still another object of the present invention to provide a liquid-phase selective silicon oxide film growing apparatus which does not degrade productivity even when various types of semiconductor wafers are produced in very small amounts.

In order to achieve the above objects, according to the present invention, there is provided a silicon oxide film growing apparatus comprising a single wafer film-forming processing tank for selectively growing a silicon oxide film by a liquid-phase growing method on only a silicon oxide film on a surface of a semiconductor wafer, a post processing unit for washing the surface of the semiconductor wafer, and wafer conveying means for conveying the semiconductor wafer between the film-forming processing tank and the post processing unit.

DESCRIPTION OF THE PREFERRED EMBODIMENT

An embodiment of the present invention will be described below with reference FIG. 1.

Figure 1:
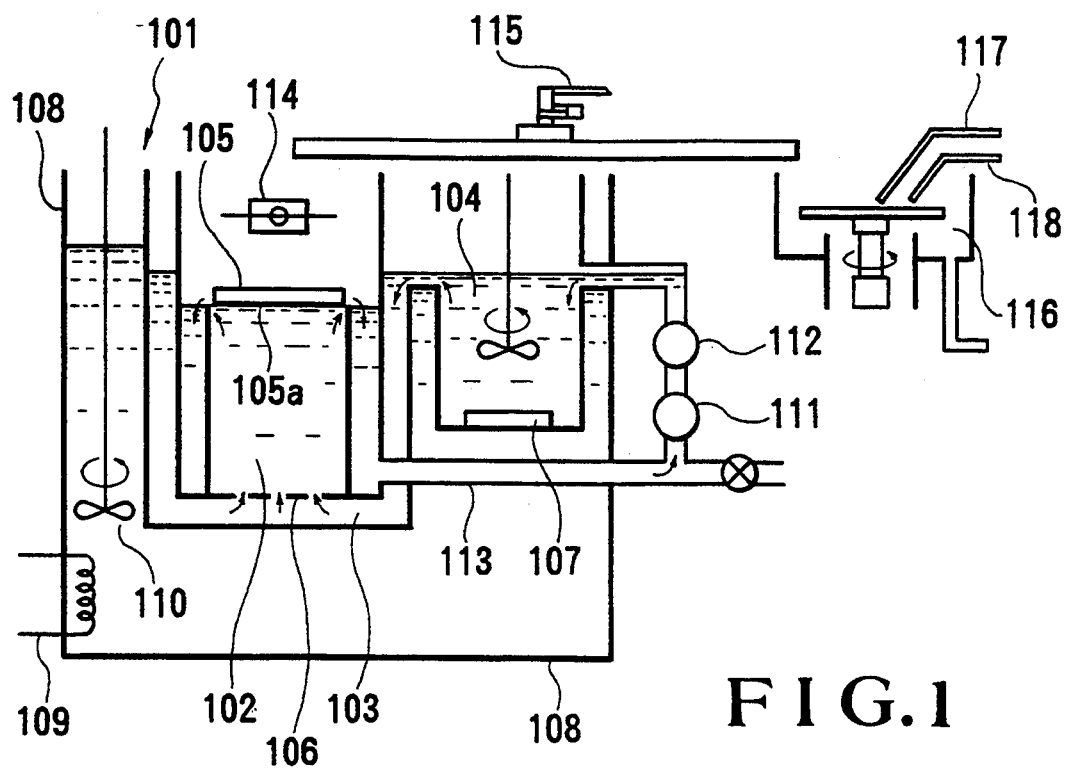
FIG. 1 is a sectional view showing the main part of a liquid-phase selective silicon oxide film growing apparatus according to an embodiment of the present invention.
Figure 2:
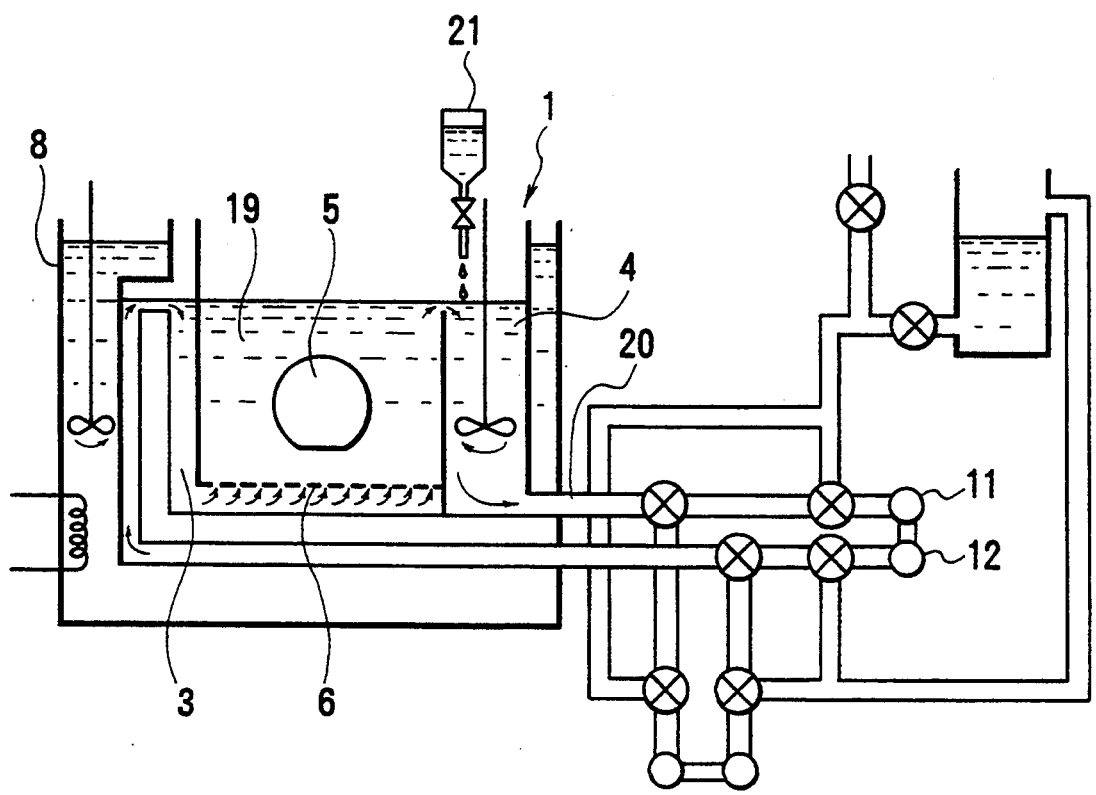
FIG. 2 is a sectional view showing the main part of a conventional liquid-phase selective silicon oxide film growing apparatus.

FIG. 1 schematically shows a liquid-phase selective silicon oxide film growing apparatus according to the embodiment of the present invention. A processing tank 101 in this apparatus comprises a contact liquid unit 102, a straightening unit 103, and a processing liquid adjustment unit 104.

In the contact liquid unit 102, a semiconductor wafer 105 is supported such that only a surface thereof facing downward is in contact with a processing liquid.

The straightening unit 103 is contiguous to the contact liquid unit 102 through a straightening plate 106. The straightening unit 103 can straighten the flow of the processing liquid.

An aluminum plate 107 is inserted in the processing liquid adjustment unit 104, the processing liquid can always be set in a supersaturated silica state. That is, the processing liquid is a hydrofluosilicic acid solution in which silica is dissolved and supersaturated.

In addition, the processing tank 101 is arranged in a constant temperature tank 108 to keep the processing temperature of the processing tank 101 constant. Water in the constant temperature oven 108 is heated by a heater 109 and agitated by a stirrer 110 to keep the water temperature constant.

The processing liquid is circulated by a pump 111, supplied to the processing liquid adjustment unit 104 through a filter 112, supplied to the contact liquid unit 102 from the straightening unit 103 through the straightening plate 106, and brought into contact with a surface 105a of the semiconductor wafer 105.

The processing liquid brought into contact with the semiconductor wafer 105 overflows the contact liquid unit 102, passes through a water supply pipe 113, and is supplied by the pump 111 again.

After silicon oxide film growth on the semiconductor wafer 105 is performed in the contact liquid unit 102 for about 1 hour, the semiconductor wafer 105 is removed from the processing liquid. After the wafer 105 is reversed, the wafer 105 is conveyed to a spin etching unit 116 by a wafer conveying robot 115.

In the spin etching unit 116, hydrofluoride-based etching solution is sprayed from an etching solution nozzle 117 to the surface 105a of the semiconductor wafer 105 to etch the surface 105a for about 10 seconds. Thereafter, while the wafer is rotated at 3,000 rpm, distilled water is sprayed from a distilled water nozzle 118 to the wafer at a pressure of about 10 kg/cm$^2$ to wash the wafer for 10 seconds. The rotational speed is increased to about 5,000 rpm to dry the semiconductor wafer 105.

The semiconductor wafer 105 is returned from the spin etching unit 116 to the wafer reversing unit 114 by the wafer conveying robot 115, and a silicon oxide film is grown on the wafer in the contact liquid unit 102 again.

As described above, when a silicon oxide film is grown while silicon oxide film growth and removal of particles in the spin etching unit 116 are repeated several times, adhesion of the particles to a photoresist or a metal wiring layer and growth of a silicon oxide film on the photoresist or the metal wiring layer can be almost completely suppressed, and a silicon oxide film can be grown with good selectivity.

This is based on the result of an experiment performed by the present inventors, i.e., the particles can be almost completely removed by the above processes within about one hour after the particles are adhered to the photoresist or the metal wiring layer.

As a matter of course, when a metal wiring layer is used, a wiring material which withstands a hydroflouride-based etching solution must be selected. For example, a noble metal such as Au or a refractory metal such as W is preferably selected as the wiring material.

In addition, the present inventors have examined materials themselves constituting the apparatus. As a result, findings that "a minimum number of particles are produced when the inner surface of the apparatus is smoothly coated with Teflon" are also be obtained. For this reason, although the inner surfaces of the processing tank 101, the water supply pipe 113, and the like are coated with Teflon in the above apparatus of the embodiment, the processing tank 101 and the water supply pipe 113 can consist of Teflon.

As described above, according to the present invention, in a silicon oxide film growing apparatus for selectively growing a silicon oxide film by a liquid-phase growing method on only a silicon oxide film on the surface of a semiconductor wafer having a photoresist pattern or a metal wiring pattern having a desired shape, a single wafer film-forming processing tank is employed, and the rear surface of the wafer is prevented from being in contact with processing liquid by a face-down scheme. In addition, since the processing tank and a processing liquid pipe consist of Teflon or are coated with Teflon, production of particles is reduced, and the service life of the processing liquid can be almost doubled.

Since the silicon oxide film growing apparatus according to the present invention has a function capable of automatically, alternately performing film-forming processing and spin-etching processing, silicon oxides adhered to or grown on a photoresist pattern or a metal wiring pattern can be almost completely removed.

According to an experiment performed by the present inventors, when a silicon oxide film was formed to have a thickness of about 1,000 Å, although particles were produced on a photoresist at 50,000 to 100,000 particles/mm$^2$ in a conventional apparatus, particles can be produced at several particles/mm$^2$ in the apparatus according to the present invention.

What is claimed is:

1. A silicon oxide film growing apparatus comprising: a contact liquid unit filled with a processing liquid for growing a silicon oxide film on a semiconductor wafer by a liquid-phase growing method, the processing liquid overflowing said contact liquid unit, the semiconductor wafer being supported with a first surface thereof facing downwardly, at least one of a photoresist film pattern and a metal wiring pattern being formed on said first surface, said first surface being in contact with the processing liquid in said contact liquid unit, a second surface of the semiconductor wafer facing upwardly and being exposed so that it is not in contact with the processing liquid;

a straightening unit for straightening and distributing a flow of the processing liquid flowing into said contact liquid unit;

a processing liquid unit adjustment unit for setting an adjustment of the processing liquid from said contact liquid unit into a supersaturated silica state; and a pump for circulating the processing liquid in an order extending from said processing liquid adjustment unit, through said straightening unit to said contact liquid unit.

2. An apparatus according to claim 1 wherein said straightening unit comprising a tank adjacent at least the bottom of said contact liquid unit, a straightening plate at an interface between the bottom of said contact liquid unit and said straightening unit, said straightening plate having a distributed number of holes therein so that said liquid in said straightening unit flows with a distributed pattern into said contact liquid unit, a container surrounding at least part of said contact liquid unit for receiving said overflowing processing liquid, a conduit for conveying said processing liquid from said surrounding container to said adjusting unit, and means for returning said processing liquid from said adjusting unit to said straightening unit.

3. The apparatus of claim 1 and a constant temperature tank of fluid containing said contact liquid unit, said straightening unit, and said adjustment unit in order to maintain the temperature of said units, heater means associated with said constant temperature tank, and means for agitating fluid in said constant temperature tank.

4. An apparatus for growing a silicon oxide film on a semiconductor wafer, said apparatus comprising means including a constant temperature tank for maintaining the temperature of said silicon oxide film growing apparatus, means in said constant temperature tank for maintaining a processing liquid surface at a level to bring said liquid into contact with the wafer, means for supporting a semiconductor wafer relative to said level in order to wet only one side of the wafer, said one side including at least one of a photoresist film or a metal wiring layer having a pattern formed thereon, spin etching means for spraying a hydrofluoride-based acid on said wafer, means for removing said wafer from said supporting means and for conveying it to expose said one side to said spin etching means for exposure to said hydrofluoride-based acid spray, and means for repeating the wetting and spray etching steps to increase the thickness of a silicon oxide layer grown on said one side of said wafer.

5. The apparatus of claim 4 and a first nozzle for directing said hydrofluoride-based acid onto said one side during said spin etching, a second nozzle for directing distilled water onto said one side during said spin etching, and means responsive to a termination of the spray of said hydrofluoride-based acid through said first nozzle for directing said distilled water through said second nozzle and onto said one side of said wafer for a period of time.

6. A silicon oxide film growing apparatus comprising:
a contact liquid unit filled with a processing liquid for growing a silicon oxide film on a semiconductor wafer by a liquid-phase growing method, the processing liquid overflowing said contact liquid unit, the semiconductor wafer being supported at said contact liquid unit with a first surface thereof facing downwardly and being wetted on only one side by said processing liquid, at least one of a photoresist film pattern and a metal wiring pattern being formed on said first surface, a second surface of the semiconductor wafer facing upwardly and not in contact with the processing liquid;
a straightening unit for distributing and straightening a flow of the processing liquid flowing into said contact liquid unit, said straightening unit comprising a tank associated with at least part of said contact liquid unit, a straightening plate at an interface between the bottom of said contact liquid unit and said straightening unit, said straightening plate having a distributed number of holes therein so that said liquid in said straightening unit flows with a distributed pattern into said contact liquid unit;
a processing liquid unit adjustment unit coupled to receive the processing liquid from said contact liquid unit, said adjustment unit setting said processing liquid into a supersaturated silica state; and
a pump for circulating the processing liquid in an order extending from said processing liquid adjustment unit, through said straightening unit to said contact liquid unit, and a container surrounding at least part of said contact liquid unit for receiving said overflowing processing liquid, a conduit for conveying said processing liquid from said surrounding container to said adjusting unit.

7. The apparatus of claim 6 and a constant temperature tank of fluid surrounding said contact liquid unit, said straightening unit, and said adjustment unit in order to maintain the temperature thereof, heater means associated with said constant temperature tank, and means for agitating fluid in said constant temperature tank.

* * * * *